(12) United States Patent
Maeuser

(10) Patent No.: US 7,354,327 B2
(45) Date of Patent: Apr. 8, 2008

(54) METHOD FOR MAKING A MULTILAYER ELEMENT WITH A TRANSPARENT SURFACE ELECTRODE AND AN ELECTROLUMINESCENT ILLUMINATING ELEMENT

(75) Inventor: Helmut Maeuser, Herzogenrath (DE)

(73) Assignee: Saint-Gobain Glass France, Courbevoie (FR)

( * ) Notice: Subject to any disclaimer, the term of this patent is extended or adjusted under 35 U.S.C. 154(b) by 590 days.

(21) Appl. No.: 10/498,822

(22) PCT Filed: Dec. 12, 2002

(86) PCT No.: PCT/FR02/04327

§ 371 (c)(1),
(2), (4) Date: Dec. 30, 2004

(87) PCT Pub. No.: WO03/061348

PCT Pub. Date: Jul. 24, 2003

(65) Prior Publication Data

US 2005/0124257 A1    Jun. 9, 2005

(30) Foreign Application Priority Data

Dec. 24, 2001  (DE) ................ 101 64 063
Nov. 27, 2002  (DE) ................ 102 55 199

(51) Int. Cl.
*H01L 51/56* (2006.01)
*H05B 33/10* (2006.01)

(52) U.S. Cl. ................ 445/24; 445/25; 427/66

(58) Field of Classification Search ................ 445/24, 445/25; 427/66; 313/500–512; 428/690, 428/917
See application file for complete search history.

(56) References Cited

U.S. PATENT DOCUMENTS

| 3,118,086 A | * | 1/1964 | Knochel et al. | ........... 313/512 |
| 4,513,023 A | * | 4/1985 | Wary | ........................ 427/66 |
| 4,857,920 A | * | 8/1989 | Kataoka et al. | ............ 313/506 |
| 4,880,475 A | * | 11/1989 | Lindmayer | ................ 427/66 |
| 5,757,125 A | | 5/1998 | Bomhower et al. | |
| 6,036,823 A | | 3/2000 | Inoguchi et al. | |
| 6,280,273 B1 | | 8/2001 | Codama | |
| 2001/0000335 A1 | | 4/2001 | Yamada | |

FOREIGN PATENT DOCUMENTS

| EP | 0 853 334 | 7/1998 |
| EP | 1 100 291 | 5/2001 |
| EP | 1 124 261 | 8/2001 |

* cited by examiner

*Primary Examiner*—Mariceli Santiago
(74) *Attorney, Agent, or Firm*—Oblon, Spivak, McClelland, Maier & Neustadt, P.C.

(57) ABSTRACT

A process for manufacturing a multilayer element with a transparent surface electrode, an electro-luminescent lighting film, and a second surface electrode. To form the transparent surface electrode, a thin-film multilayer system, including at least an electrically conducting part film and thereafter a dielectric part film, is applied to a substrate. An EL lighting film and at least the second surface electrode are applied one after the other on the thin-film multilayer system by screen printing. The two surface electrodes are respectively connected to an electrical connection element for connection to the voltage source.

11 Claims, 1 Drawing Sheet

Figure 1:
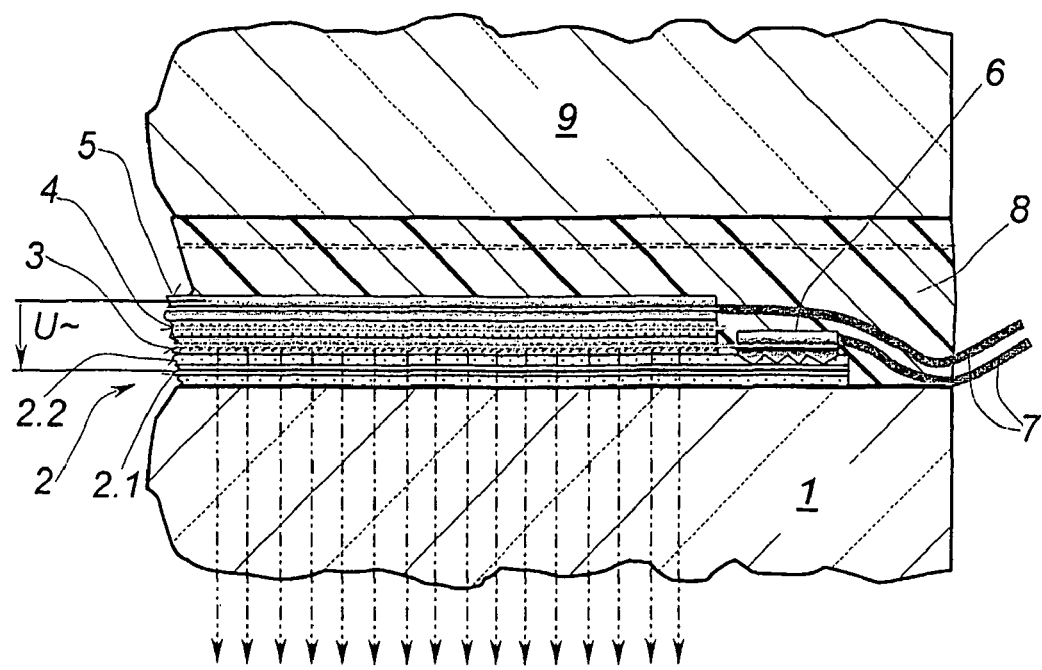

METHOD FOR MAKING A MULTILAYER ELEMENT WITH A TRANSPARENT SURFACE ELECTRODE AND AN ELECTROLUMINESCENT ILLUMINATING ELEMENT

CROSS-REFERENCE TO RELATED APPLICATIONS

The present patent document is the U.S. counterpart of WO 03/06 1348, and in turn claims priority to German application number 10164063.3 filed on Dec. 24, 2001 and German application number 10255199.5 filed on Nov. 27, 2002, the entire contents of each of which are hereby incorporated herein by reference.

The invention relates to a process for manufacturing a multilayer element with a transparent surface electrode and an electroluminescent lighting (EL) element having the features of the preamble of claim 1.

The term "multilayer element" is understood here to mean a unit composed of a carrier substrate and the EL element, which itself consists of several layers, said element being applied to, laminated onto or printed on the carrier substrate.

To achieve as high a lighting power of the EL element as possible, the surface electrode must be as transparent as possible to the visible light emitted by said element. This electrode counts in principle as one of the layers of the functional element and usually forms the boundary surface between the carrier substrate and the functional element.

Highly light-transparent materials, for example glass, plastic panels (for example polycarbonate panels) and plastic (PET or polyethylene terephthalate) sheets are suitable as a carrier substrate for the visible light emitted. If plastic sheets are used as the actual carrier substrate, these may be laminated without any problem onto rigid substrates after construction of the EL element.

At least one adhesive intermediate film and another (rigid) covering film may then follow on top of the EL element constructed on its carrier substrate so as to form a laminated assembly. Admittedly, it is not necessarily essential to embed the EL element between two rigid panels of a laminated panel assembly, but this arrangement will be preferred for safety reasons considering that the supply voltage is very high. Embedding the EL element in a laminated panel assembly also protects it from mechanical effects and from penetration by moisture and dirt which could cause perturbations. If transparency or light emission are required only on one side, nontransparent rigid plates of any material may of course be used on the other side.

The basic principles of electroluminescence have been known for a long time. A detailed document on this technology, with application examples, descriptions of materials and light colors that can be achieved is available from the Internet address "http://www.dupont.com/mcm/luxprint/about.html" (version: November 2002), so that it is unnecessary to go into detail here.

The EL elements in accordance with the above are usually manufactured by screen printing. To do this, the substrate is firstly coated (preferably by spraying), with the transparent electrode to which the film with the lighting function is applied. Next come the dielectric film, for example made of barium titanate, which has a very high dielectric constant, and then the second electrode, which does not necessarily have to be transparent. It consists of a good electrically conducting metal such as, preferably, silver.

Light emission by an EL element starts as soon as the functional film is in an AC electric field set up between the two electrodes. The question of knowing where exactly the dielectric separates the electrodes is then of secondary importance. However, measures must be taken to ensure that no breakdown occurs at any point, because a breakdown may immediately cause local destruction of the functional film, the destruction subsequently spreading.

The power of the electric field in a thick-film printed EL element may be of the order of magnitude of a few $10^6$ V/m. Should there be insufficient insulation, breakdowns may occur which are manifested in the form of black spots. In practice, UV-curable varnishes compatible with screen printing are used, for example, as additional insulation or dielectric film.

Document EP-A1-0 267 331 discloses a laminated panel assembly for vehicles with a mark embedded in the adhesive layer of the laminate, which mark is displayed, or may be back-lit, by an EL element. The necessary electrical wiring is made practically invisible by being in the form of thin transparent conducting tracks or films made of metals or oxides inside the laminate. After applying the supply voltage, the luminous mark seems to be suspended in the panels with no wiring visible. The document cited discloses two different embodiments of the EL elements. In the first one, two conducting voltage electrodes are provided on the same substrate and are joined together by the illuminating element, which includes, on its side, a bridging electrode. From the electrical standpoint, two capacitors connected in series are thus formed. In the second type of structure, one of the two electrodes is deposited as a thin transparent film on the two internal surfaces of the laminated panel assembly, and the lighting element is placed between them, alongside the separating dielectric film.

In this case, as in many other cases, the transparent electrodes of the EL elements preferably consist of indium tin oxide (ITO), the light-emitting (phosphor) film being applied directly to this electrode in order to obtain a high lighting power.

Many solutions have already been proposed, in which the transparent electrode is also designed for various reasons as a multilayer system in which a dielectric film is adjacent to the EL functional film. With such a distribution of the dielectric films on both sides of the lighting film, the sum of the insulating effects must be high enough.

Especially in the case of thin-film EL elements with in any case small total film thicknesses, it is known (see for example U.S. Pat. No. 6,036,823 and U.S. Pat. No. 6,358,632) to produce films as thin as possible with dielectric constants as high as possible on both sides of the actual EL functional film. Electric field breakdown through the functional film must thus be avoided.

Document DE-A1-19 825 435 discloses an EL arrangement in which dielectric films are deposited by the thick-film technique on both sides of the EL lighting film. This document also indicates various measures for affecting the color of the light emitted.

Various descriptions of highly transparent multilayer systems for visible light are known, which comprise, as core, thin metal films or films of electrically conducting doped metal oxides and which are essentially distinguished by thermal insulation or reflection properties. With a suitable arrangement of the electrodes, these multilayer systems may also serve for electrical surface heating if a current is guided along the extension of the conducting film, which heats because of its ohmic resistance. In general, such known multilayer systems also include simple or multiple dielectric films, for example made of silicon nitride, etc., which must of course be transpierced for electrically contacting the conducting films. Such multilayer systems have already been used as antennas.

The prior German patent application 10164063.3 discloses a laminated assembly with a rigid transparent panel, a transparent surface electrode applied on top and a flat multilayer EL lighting element, the transparent surface electrode of which can be used, by means of additional electrical connections, as heating film in order to establish predefined temperatures of the EL lighting element. Such a laminated assembly may for example be used in a vehicle, for example as a glazed roof whose surface lights up, acting as interior lighting in the passenger compartment when dark.

In the industrial manufacture of EL surface elements, the dielectric of an EL element must be printed in two or more operations so as to achieve both the necessary thickness and the necessary insulating effect. Since the coating must be dried after each printing operation, this entails very disruptive waiting times. Screen printing on curved substrates requires, in any case, a considerable amount of work.

The objective of the invention is therefore to provide a process whereby the number of printing operations when printing functional films of an EL element on a substrate can be reduced.

This objective is achieved within the framework of the invention thanks to the features of claim 1. The features of the subclaims provide advantageous improvements to the process according to the invention.

Consequently, the EL element is formed on a transparent thin-film electrode, which already includes at least part of the dielectric separating film of the EL element. Between the actual electrically conducting electrode film and the EL lighting film, there is at least one dielectric part film.

The dielectric film of the transparent surface electrode placed on top acts as an additional insulator against breakdown. Using a multilayer dielectric system with the insulator described here on the surface, the printing thickness of the dielectric film to be printed later may be considerably reduced, and it is possible, where appropriate, to dispense with a second screen printing operation for applying a film of varnish (UV-curable varnish). Optionally, the function of the second dielectric film may even be completely fulfilled by the dielectric film on the transparent surface electrode if its insulating effect is great enough, with sufficient transparency to light.

With dielectric systems based on interference films, surface resistances of 4 to 6 ohms/square at least are obtained. By contrast, the standard transparent thin ITO films have a surface resistance between 50 and 100 ohms/square. Since the film resistance in the scheme of replacing an EL element is equal to the series resistance, which is purely real and is the origin of the active power, and hence the lost power converted into heat, the active power and thus the thermal behavior of an EL element may be reduced several times compared with an ITO surface electrode by using a surface electrode having a greatly reduced surface resistance.

At the same time, it is possible, by a targeted selection of the film thicknesses and materials of the multilayer system forming the transparent surface electrode, also to adapt the visual appearance of the EL element (when no voltage is applied) and the perceptible color of the light emitted. The commercially available EL lighting films do not necessarily correspond to the expectations of the end users as regards color.

If the capacitance of the capacitor formed by the two surface electrodes on either side of the functional film has to be maintained, it is possible, by using a very thin dielectric film instead of a relatively thick printed dielectric film, to also reduce the thickness of the latter so as to adapt the overall dielectric constant to the reduced slit width of the capacitor. In this case, it is important for the insulating film to be isotropic, i.e. possess the same dielectric properties in all directions and be free of any "pinholes".

It is not absolutely necessary to construct the multi-layer electrode system on a rigid substrate. On the contrary, the multilayer system may also be deposited on a thin plastic carrier film, for example made of polyethylene terephthalate (PET), and joined by means of a suitable adhesive film to a rigid substrate. However, this is also known per se, so that it is unnecessary to enter into details here.

If the EL element has to be printed on a curved glass substrate, it will be preferred to construct the transparent element on a multilayer system which can withstand high temperatures (about 650° C.) during the glass bending operation.

It is particularly advantageous to construct the EL element itself in the latter case mentioned above with films that may themselves be thermally stressed to a high enough level in order to print them after the surface electrode has been deposited on a flat glass substrate and so that they can withstand, without being damaged, the temperatures during the subsequent operation of bending the latter. The optionally printed dielectric film and the second surface electrode already exist with such properties; the thermal behavior of suitable EL lighting films is currently being studied.

Another advantage of the multilayer system forming the transparent surface electrode is that it has a strong thermal insulation effect. This has, for example, very positive repercussions for the glass roof panels for vehicles provided with EL elements, owing to the fact that the subjective sensation of heat by the passengers in the vehicle is improved.

Quite generally, a suitable multilayer system may be described as a heat-resistant solar-radiation and/or IR reflecting film based on silver or other conducting metals.

One particularly appropriate multilayer system for the intended use described here is composed of the following multilayer: substrate/$Si_3N_4$/ZnO/Ti/Ag/ZnO/$Si_3N_4$/ZnO/Ti/Ag/ZnO/$Si_3N_4$. It can withstand high temperatures and therefore can be applied to a glass sheet before it is bent and/or prestressed, and it has the desired optical properties (transparency and color) and electrical properties (surface resistance and dielectric constant).

To increase the mechanical strength and chemical resistance of a multilayer system, it is known, however, that it is possible in particular to configure the top antireflection film, or part of the top anti-reflection film, especially the covering area located uppermost, as a film based on mixed oxides, that is to say a film composed of several oxides. The hardness and the chemical stability of the multilayer system may thus be improved.

According to the document EP-B1-0 304 234, the mixed oxide film consists of at least two metal oxides, one of the metal oxides of which is a Ti, Zr, or Hf oxide and the other metal oxide is a Zn, Sn, In or Bi oxide.

Document EP-A1-0 922 681 discloses a configuration of the top antireflection film as two part films, the top part film of which consists of a mixed oxide based on zinc and aluminum, especially with a spinel structure of the $ZnAl_2O_4$ type.

Document DE-C1-19 848 751 discloses a multilayer system with a mixed oxide film which, with respect to the overall metal content, contains 35 to 70% by weight of Zn, 29 to 64.5% by weight of Sn and 0.5 to 6.5% by weight of one or more of the elements Al, Ga, In, B, Y, La, Ge, Si, As, Sb, Bi, Ce, Ti, Zr, Nb and Ta.

Document U.S. Pat. No. 4,996,105 teaches multilayer systems with mixed oxide films having the composition $Sn_{1-x}Zn_xO_y$. The mixed oxide films are sputtered from a zinc-tin stoichiometric alloy in which the Zn/Sn ratio is 1.1 at %.

Documents EP-A1-0 464 789 and EP-A1-0 751 099 also disclose multilayer systems with antireflection films made of mixed oxides. In this case, the mixed oxides, based on ZnO or SnO, contain an addition of Sn, Al, Cr, Ti, Si, B, Mg or Ga.

Multilayer systems that can be highly stressed thermally are also known in various constructions. In a first group of multilayer systems that can be highly stressed thermally, the antireflection films, which are separated from the silver functional film by thin metal blocking films of CrNi, are composed respectively of $Si_3N_4$. The multilayer system disclosed in the document EP 0 883 585 B1 also forms part of this group, the metal blocking film being, however, in this case composed of Si. Such multilayer systems are admittedly very stable thermally but, because of the known problems when sputtering nitride, are very expensive to manufacture. In addition, sputtering relatively thick $Si_3N_4$ films is not without problems as regards mechanical tension in the films.

Of course, to manufacture the multilayer conducting system of the transparent electrode, other technologies, such as for example plasma CVD, may also be used, by means of which greater film thicknesses may be obtained compared with the sputtering technology.

Forming part of the second group of multilayer systems that can be highly stressed thermally are those which, in addition to the nitride films, such as $Si_3N_4$ or AlN films, also have oxide films, especially in the region of the covering film. For example, document DE 19 640 800 C2 discloses a multilayer system in which is placed, between the metal blocking film and the oxide or nitride covering film, an intermediate film of a nitride or oxynitride formed from the metal of the metal blocking film. Another multilayer system of this type, known from document DE 10 105 199 C1, is distinguished by the fact that an $Si_3N_4$ or AlN film is placed between the silver film and the metal blocking film. In the multilayer system known from document EP 0 834 483 B1, a $TiO_2$ intermediate film at least 5 nm in thickness is placed between a Ti metal blocking film and the covering film, and placed on this intermediate film is a covering film of an oxide, nitride or oxynitride of Bi, Sn, Zn or a mixture of these metals.

In a third group of multilayer systems that can be highly stressed thermally, the individual films, apart from the functional film and the metal blocking film, are composed of purely oxide films. Oxide films may usually be manufactured more simply and more economically than nitride films. In this case, however, the metal blocking film has a relatively large thickness. A multilayer system of this type is disclosed, for example, in document DE 19 852 358 C1. The blocking metal consists in this case of an alloy of aluminum with one or more of the elements Mg, Mn, Cu, Zn and Si as components of the alloy.

Throughout this exhaustive presentation, it should be noted that there are many multilayer systems that may be suitable as surface electrode of an EL element for the present application; to select or modify a suitable multilayer system within the present context requires merely routine checks and tests by the experts responsible for carrying them out.

Further details and advantages of the subject matter of the invention stem from the drawing of an illustrative example and the corresponding detailed subscription that follows.

Figure 2:
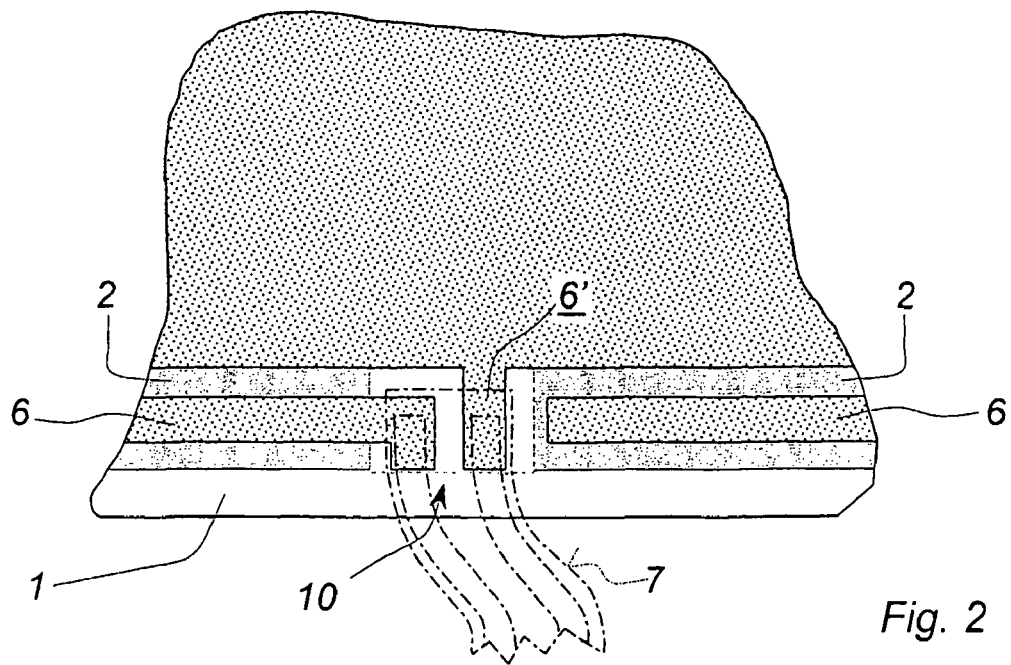

The drawing shows, in a highly simplified representation and not drawn to scale:

FIG. 1, a sectional view of a laminated panel assembly with an electroluminescent surface element constructed on a transparent surface electrode having at least one part of the dielectric; and FIG. 2, a detailed view of a contact region for making connections to the outside of the EL element.

FIG. 1 shows a surface of a transparent rigid panel 1 on which has been deposited a multilayer system 2 highly transparent to visible light, which system comprises at least one electrically conducting metal film 2.1, preferably made of silver. This film 2.1 constitutes the actual transparent surface electrode of the EL element. Provided here between the film 2.1 and the surface of the panel are further films, especially an antireflection dielectric film, for example made of silicon nitride ($Si_3N_4$) and optionally a zinc oxide (ZnO) film favoring the growth of the silver film 2.1. Especially in a multilayer system that can be highly stressed thermally, that is to say able to be heated without any damage up to the glass softening temperature, other intermediate films such as, for example, metal blocking films, may be added. The desired properties (adhesion to the substrate/glass, light refraction, colors in transmission and reflection, infrared reflection properties, electrical conductivity, protection of the silver film(s) from oxidation, etc.) of the multilayer system may be influenced within vast ranges by their combination, sequence and thicknesses. The usual surface resistances of such multilayer systems lie between 2 and 4 ohms/square. As such multilayer systems are, as already mentioned, already known in many forms, the part films will not be presented here more exhaustively.

Deposited on top of the electrode film 2.1 is also at least one dielectric film 2.2 which constitutes, within the context of the invention, part of the dielectric of the capacitor in the field of which the EL element is made to light up. Although this is not illustrated, other films may also be added in this region, for example blocking films which guarantee the desired properties of the overall multilayer system during production, during subsequent conversion and in the assembly state, in a reproducible and sustainable manner. In particular, a high mechanical wear resistance may be obtained by the composition and the combination of the top (covering) films of such a multilayer system; $Si_3N_4$ films are especially suitable as external covering films because of their high hardness.

The visible light transmission of the coated panel 1 is preferably at least 75%. This is a minimum value required in Europe for vehicle windshields.

The glass panel 1 provided with the multilayer system 2 forms the overall substrate for the EL element. The lighting film 3 of the EL element is printed, preferably by a screen printing process, on the outer film of the multilayer system 2 so as to leave free, at least along one side, a narrow border band of the multilayer system 2. This border band is used for making electrical contact with the electrode film 2.1. In a manner known per se, a distance of a few millimeters from the edge of the panel will also be maintained in the case of the multilayer system 2 itself, so as to prevent corrosion emanating from the edge of its metal films.

Another dielectric film 4 is printed on top of the lighting film 3 and, finally, the second surface electrode 5 of the EL element is printed, again preferably by a screen printing process, on top of the dielectric film 4. A conducting track 6 is printed along the free border of the multilayer system 2; this is preferably carried out during the same operation as the printing of the second surface electrode 5. The conducting track 6 forms the electrical connection for the voltage supply for the transparent electrode film 2.1. It is symbolically indicated that the material of the conducting track 6 crosses the dielectric film 2.2. Finally, a pair of cables, shown in a very simplified manner, represent the external electrical connections 7 for the two electrodes 2.1 and 5. The manufacture of such connections, especially by soldering, is known per se. For the present application, particular measures that will form the subject of more detailed explanations in conjunction with FIG. 2 must, however, be taken where appropriate.

The printed films 3 to 5 and the conducting track 6 are considerably thicker than the individual films of the multilayer system and than said system in its entirety; the actual ratios cannot be shown here to scale. This is why the thicknesses of the printed films are shown only in part and are interrupted by dotted bands. Although the total thickness of a multilayer system that can be highly stressed thermally and that is preferred for this application may vary between 130 and 180 nm, for example depending on the desired coloration, the printed films 3, 4 and 5 of the EL element are considerably thicker.

The table below is a comparison between the conventional EL elements according to the recommendation of the manufacturer DuPont, and the smaller thicknesses with the modified transparent electrode according to the invention.

|  | Recommendation with ITO electrode | Same EL element with electrode of the multilayer system |
| --- | --- | --- |
| Lighting substance | 30–40 μm | 23–25 μm |
| Dielectric | 20 μm | 8–10 μm |
| Silver | 8 μm | 6 μm |
| Insulation film for passivation | 30 μm | None |
| Total | 60 μm + passivation | About 40 μm |

It may be seen that, with a transparent surface electrode designed according to the invention, both the actual lighting film and the other films of the EL element may be made thinner.

The AC voltage supply for the EL element, via its two electrodes 2.1 and 5, is indicated symbolically by an arrow denoted by U and its surface light emission in the applied AC electric field is denoted by a series of arrows passing through the multilayer system 2 and the panel 1, emanating from the functional film 3.

Provided on top of the EL element or of the second surface electrode 5 is an adhesive film 8 which extends as far as the outer edge of the panel 1. It joins, via the surface, a second rigid panel 9 with the panel 1 and with the films applied on top of it. The cable pair 7 is also embedded in the adhesive film 8. The latter forms an impermeable seal for the components of the EL element with respect to the outside. It also protects the multilayer system 2, as it is joined directly, by adhesive in the uncoated border region of the panel 1, with the surface of the latter. The adhesive film may be manufactured from a thermoplastic sheet that can be melted or from a transparent mass that can be cast, which is incorporated, in a manner known per se, into an intermediate space defined between the two rigid panels 1 and 9 and then cured.

It is possible to provide, in the abovementioned border region, an opaque coating, not shown here and known per se, formed from a preferably baked screen printing paste, which can also be used for the optical coating of the cable link and optionally of the conducting track 6. This border coating preferably extends from the outer edge of the panel inwards by a distance such that its end lies just beneath the outer edge of the lighting film 3, while still being able to be placed on or beneath the edge of the multilayer system 2. That is to say it may be applied before or after said system has been deposited. The contrast in the transition from the opaque coating to the illuminating surface may be attenuated where appropriate, in a manner known per se, by an embedment-type gradation.

It is obvious that structures or subassemblies may also be provided, if so desired, in the visible illuminating field of the EL element. This could be achieved particularly simply by enlarging the abovementioned border coating, by producing, during the same operation when applying it, a pattern on the surface of the panel 1 (before or after deposition of the multilayer system 2).

FIG. 2 shows in detail one embodiment of a connection area for the EL element, which is particularly suitable for embedding in a laminated panel assembly. This shows a view of the top on the coated surface of the panel 1.

From the industrial standpoint, a contact area 10 is deposited in a manner known per se on the rigid panel 1, if possible along its edge, unlike the highly simplified representation of the cable line of FIG. 1, in which area the contact surfaces to be connected to the outside are grouped together so as to be very close to one another. Thus there is the advantage of simultaneous, possibly automated, soldering with sections of cables to be guided toward the outside. A presentation of such a multiple connection area will be found, for example, in document DE-C2-19 536 131.

In the present application, to introduce the voltage as uniformly as possible into the transparent surface electrode 2, the conducting track 6 is in practice sent like a frame around the overall surface of the EL element. This frame is interrupted, in the region of a section of conducting track 6', in the form a connection with the second surface electrode 5. The electrical connection between this conducting track 6' and the surface electrode 5 must, of course, also be made with the purpose of introducing the electrical potential in this surface as uniformly as possible. No particular prescription is imposed, however, as regards the greatest thickness of the surface electrode 5, compared with the thickness of the transparent surface electrode 2, and as regards the least surface resistance of the latter.

In the illustrative example, the section 6' was simply manufactured both with the surface electrode 5 and the conducting track 6 by screen printing an electrically conducting paste during the same operation. To avoid perturbations, the contact region 10, in which the soldered contact points for the external connections 7 (indicated here only as dotted lines in the form of flat strip conductors) are located, is stripped of the coating 2 (or is initially not coated at all). During integration of this connection into a laminated panel assembly in a manner similar to figure 1, the region between the underside of the flat strip conductor and the surface of the panel must be carefully sealed, for example using an adhesive.

The invention claimed is:

1. A process for manufacturing a multilayer element with a transparent surface electrode, an electro-luminescent lighting film, and a second surface electrode, the surface electrodes being provided with electrical connections for applying a voltage, the process comprising:

applying, to form the transparent surface electrode, a thin-film multilayer system, including at least an electrically conducting part film and thereafter a dielectric part film, to a substrate;

applying an EL lighting film and at least the second surface electrode one after another on the thin-film multilayer system;

connecting, respectively, the surface electrodes to an electrical connection element for connection to a voltage source; wherein the multilayer system is constructed as follows:
substrate/$Si_3N_4$/ZnO/Ti/Ag/ZnO/$Si_3N_4$/ZnO/Ti/Ag/ZnO/$Si_3N_4$.

2. The process as claimed in claim 1, further comprising printing another dielectric film between the EL lighting film and the second surface electrode.

3. The process as claimed in claim 2, wherein the transparent surface electrode is manufactured by application of a thin-film multilayer system that can be highly stressed thermally, suitable especially for glass bending and/or prestressing temperatures, with at least one conducting part film.

4. The process as claimed in claim 2, further comprising printing a conducting track on a part of a surface of the transparent surface electrode to connect the transparent surface electrode to the voltage source.

5. The process as claimed in claim 4, wherein the conducting track is printed during the same operation as that for the second surface electrode.

6. The process as claimed in claim 1, wherein the transparent surface electrode is manufactured by application of a thin-film multilayer system that can be highly stressed thermally, suitable especially for glass bending and/or prestressing temperatures, with at least one conducting part film.

7. The process as claimed in claim 1, further comprising printing a conducting track on a part of a surface of the transparent surface electrode to connect the transparent surface electrode to the voltage source.

8. The process as claimed in claim 7, wherein the conducting track is printed during a same operation as that for the second surface electrode.

9. The process as claimed in claim 1, wherein, in a region of a contact area, for making external electrical connections for the surface electrodes, the thin-film multilayer system is locally absent, thus either not applied or removed after application to the entire surface.

10. The process as claimed in claim 1, further comprising applying a silicon nitride covering film as the dielectric part film of the multilayer system.

11. The process as claimed in claim 1, further comprising applying an oxide or oxynitride film as the dielectric part film.

* * * * *